(12) United States Patent
Seki et al.

(10) Patent No.: US 7,678,671 B2
(45) Date of Patent: Mar. 16, 2010

(54) METHOD OF FORMING EPITAXIAL SIC USING XPS CHARACTERIZATION

(75) Inventors: Akinori Seki, Shizuoka-ken (JP); Yukari Tani, Nagoya (JP); Noriyoshi Shibata, Nagoya (JP)

(73) Assignees: Toyota Jidosha Kabushiki Kaisha, Toyota-shi, Aichi-ken (JP); Japan Fine Ceramics Center, Nagoya (JP)

( * ) Notice: Subject to any disclaimer, the term of this patent is extended or adjusted under 35 U.S.C. 154(b) by 222 days.

(21) Appl. No.: 11/586,680

(22) Filed: Oct. 26, 2006

(65) Prior Publication Data
US 2007/0096109 A1 May 3, 2007

(30) Foreign Application Priority Data
Oct. 27, 2005 (JP) .............................. 2005-312628

(51) Int. Cl.
*H01L 31/0312* (2006.01)
(52) U.S. Cl. ......................................... 438/478; 257/77
(58) Field of Classification Search .................. 257/77, 257/E21.054, E21.182, E21.541, E21, 603, 257/E21.605, E29.104, E31.049, E33.035; 438/481, 478
See application file for complete search history.

(56) References Cited

FOREIGN PATENT DOCUMENTS

| JP | 2003-234301 | 8/2003 |
|---|---|---|
| JP | 2004-189598 | 7/2004 |
| JP | 2004-193631 | 7/2004 |

OTHER PUBLICATIONS

F. La Via et al, Effects of Epitaxial Layer Growth Parameters on the Defect Density and on the Electrical Characteristics of Schottky Diodes, Materials Science Forum, vols. 483-485, pp. 429-432, available online May 15, 2005.*

Wai-Kai Chen, ed. The VLSI Handbook. Boca Raton: CRC Press, 2000.*

Gupta et al, "CVD Growth and Characterization of 3C-SiC Thin Films", Oct. 2004, Bull. Mater. Sci., vol. 27, No. 5, pp. 445-451, hereafter Gupta.*

H. Behner et al, "Surface composition of CVD-grown alpha-SiC layers- an XPS and LEED study", 1996, Applied Surface Science, vol. 99, pp. 27-33.*

A. Santoni et al, "XPS and STM study of SiC synthesized by acetylene and disilane reaction with the Si(100)2x1 surface", 2005, Surface Science, vol. 582, pp. 125-136.*

Nakagawa, H., et al., "Self-Ordering of Nanofacets on Vicinal SIC Surfaces," *Phys. Rev. Ltrs.*, vol. 91, No. 22 (Nov. 28, 2003), pp. 226107-1-226107-4.

* cited by examiner

*Primary Examiner*—David Vu
*Assistant Examiner*—Suberr Chi
(74) *Attorney, Agent, or Firm*—Finnegan, Henderson, Farabow, Garrett & Dunner, LLP

(57) ABSTRACT

A semiconductor material having a stepwise surface structure of (0001)-plane terraces and (11-2n)-plane steps [$n \geq 0$] on the SiC substrate, a semiconductor device using the same and a method of producing the semiconductor material in which a carbon-rich surface is formed on the SiC substrate prior to epitaxial growth of an SiC crystal, the carbon-rich surface satisfies the ratio $R=(I_{284.5}/I_{282.8})>0.2$, wherein $I_{282.8}$ ($I_{SiC}$) is an integrated intensity of a C1s signal having a peak at the binding energy relating to stoichiometric SiC (in the region of 282.8 eV), and $I_{284.5}$ ($I_C$) is an integrated intensity of a C1s signal having a peak at the binding energy relating to graphite, $SiC_x$ ($x>1$), or $Si_yCH_{1-y}$ ($y<1$) (in the region of 284.5 eV), as measured by an X-ray photoelectron spectroscopic analyzer (XPS).

15 Claims, 3 Drawing Sheets

4μm

METHOD OF FORMING EPITAXIAL SIC USING XPS CHARACTERIZATION

CROSS-REFERENCE TO RELATED APPLICATION

This application claims priority under 35 USC 119 from Japanese Patent Application No. 2005-312628, the disclosure of which is incorporated by reference herein.

BACKGROUND OF THE INVENTION

1. Field of the Invention

The present invention relates to a semiconductor material, a production method thereof and a semiconductor device and, in particular, to a silicon carbide-based semiconductor material favorably used for production of devices having a step-terrace structure such as quantum wire devices, optical devices and electronic devices, a semiconductor device using the same, and a method of producing the semiconductor material.

2. Description of the Related Art

Various semiconductor materials other than silicon have been studied with a view to improvements in mobility and performance of semiconductor devices. Silicon carbide (SiC), a semiconductor material having a larger band gap than silicon, has in recent years shown promise in terms of application to power devices, high-frequency devices, and the like.

For a silicon carbide substrate, a 4H—SiC or 6H—SiC substrate, in particular, a substrate having a (0001) plane is in wide use. To form a SiC thin film on the substrate by performing an epitaxial growth process, an inclined substrate from the (0001) plane as the standard plane, for example, a substrate tilted toward the [11-20] axis by 8°, in the case of a 4H—SiC substrate is commonly used, whereby a step-terrace pattern is formed on the surface of the SiC substrate.

For example, a method of forming a step-terrace structure by keeping a 4H—SiC substrate in an HCl (0 to 0.1%)-added $H_2$ atmosphere at 1,430° C. for 15 to 30 minutes has been disclosed (see, for example, H. Nakagawa et al., PRL91 (2003) 226107-1-4).

In connection with the above method, a method of depositing a SiC thin film on a SiC bulk substrate by supplying a gas containing nitrogen intermittently after supplying material gases which contain Si and C has also been disclosed (see, for example, Japanese Patent Application Laid-Open (JP-A) No. 2003-234301).

It is essential that the SiC film can be formed by epitaxial growth on the stepwise pattern of the step-terrace structure to produce devices using the step-terrace structure such as quantum wire devices, optical devices and electronic devices. However, in conventional techniques, the stepwise pattern is formed on the substrate surface at a temperature of 1,430° C., which is below the favorable range for a 4H—SiC to grow epitaxially, and hence the stepwise pattern cannot retain its structure due to deformation caused by the increase of temperature.

Furthermore, the above-mentioned method of depositing a SiC thin film by intermittently supplying a nitrogen-containing gas is not intended for forming a stepwise pattern on the substrate surface, but for eliminating the stepwise pattern to smooth the substrate surface by performing epitaxial growth when a SiC thin film is grown on the above-mentioned substrate having an off angle.

Thus, the method of forming a desirable stepwise pattern, in particular a stepwise pattern exhibiting favorable periodicity, e.g. a periodic stepwise pattern having a terrace width of 40 nm or more and a step height of 5 nm or more, on the surface of a SiC substrate is yet to be established.

SUMMARY OF THE INVENTION

In view of the above circumstances, the present invention provides a semiconductor material having a stepwise pattern (step-terrace structure) which is thermally stable and superior in periodicity, a production method thereof and a semiconductor device exhibiting a favorable light-propagation property.

A first aspect of the present invention provides a semiconductor material having a stepwise surface structure consisting of (0001)-plane terraces having a width of 40 nm or more and (11-2n)-plane steps having a height of 5 nm or more, where $n \geq 0$.

A second aspect of the invention provides a semiconductor device using the above-mentioned semiconductor material.

A third aspect of the present invention provides a method of producing a semiconductor material in which a carbon-rich surface is formed on a SiC substrate having a [0001] axis tilted toward the [11-20] direction by 1° or more by heating under a carbon-containing atmosphere prior to forming a SiC crystal surface thereon by performing epitaxial growth.

DETAILED DESCRIPTION OF THE INVENTION

Figure 1:
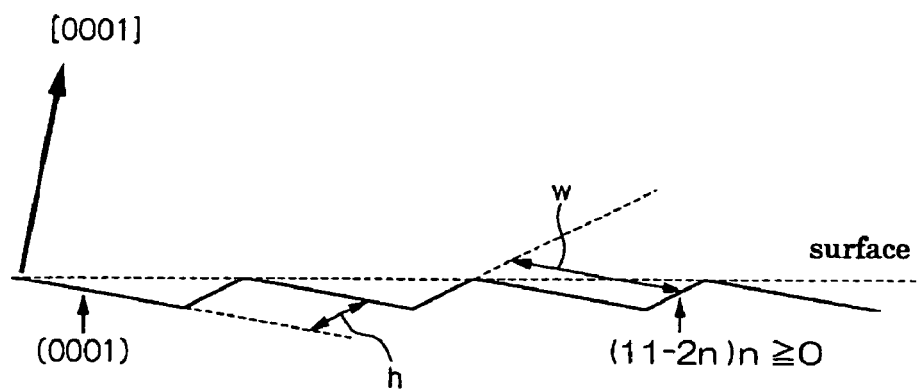
FIG. 1 is a schematic view illustrating the step-terrace structure formed by the present invention.

The present invention is based on the finding that a periodical step-terrace structure of SiC can be obtained by forming a surface containing an excess amount of carbon on a SiC substrate having a [0001] axis tilted toward the [11-20] direction by 1° or more in a carbon-containing atmosphere, prior to performing epitaxial growth of SiC on the surface thereof.

To achieve the above-mentioned object, the semiconductor material of the present invention is constituted by a stepwise surface structure consisting of (0001)-plane terraces having a width of 40 nm or more and (1-2n)-plane steps, where $n \geq 0$, having a height of 5 nm or more.

According to the semiconductor material of the present invention, surface structure having a highly periodic stepwise pattern (step-terrace structure), and a step bunching of such a large scale which has not been achieved by any conventional methods, is formed. Therefore, a waveguide structure or a quantum wire structure can be obtained easily and the waveguiding efficiency can be enhanced, thereby the performances such as operation speed and high-temperature operation can be efficiently improved, thereby a simplified method of production of various devices such as a waveguide device and a quantum wire device can be achieved.

The stepwise pattern is formed so that the terraces have a width of 40 nm or more and steps have a height of 5 nm or more, which is effective in terms of waveguiding regulation.

The semiconductor device of the present invention is constructed by using the semiconductor material according to the present invention. Use of a semiconductor material having a surface structure of highly periodic stepwise pattern (step-terrace structure) is effective in producing a semiconductor device which is superior in waveguiding efficiency and in performances such as mobility and high-temperature operation efficiency, and the production method of such a device can be made easy.

The method of producing a semiconductor material of the present invention is a method in which a SiC substrate having a [0001] axis tilted toward the [11-20] direction by 1° or more is heated under a carbon-containing atmosphere to form a carbon-rich surface on the substrate, and a SiC crystal is epitaxially grown on the surface thereof.

In the method of producing a semiconductor material of the present invention, by heating a substrate having a [0001] axis tilted toward the [11-20] direction by 1° or more, a carbon-rich surface can be formed in the region where the stepwise pattern is to be formed, and by performing epitaxial growth of SiC on the carbon-rich surface, periodic stepwise pattern such as a stepwise surface structure consisting of terraces having a width of 40 nm or more and steps having a height of 5 nm or more can be formed more easily.

The carbon-rich surface of the present invention is preferably the surface in which the ratio $(I_C/I_{SiC}=R)$ of $I_{SiC}$, an integrated intensity of a signal relating to stoichiometric SiC, and Ic, an integrated intensity of a signal relating to carbons other than the signal relating to stoichiometric SiC, is greater than 0.2, as measured by an X-ray photoelectron spectroscopic analyzer (XPS).

Specifically, a surface in which the ratio $(I_{284.5}/I_{282.8}=R)$ of $I_{282.8}$ $(I_{SiC})$, an integrated intensity of a signal having a peak at a binding energy relating to stoichiometric SiC (in the region of 282.8 eV), and $I_{284.5}$ (Ic), an integrated intensity of a signal having a peak at a binding energy relating to graphite, $SiC_x$ (x>1), or $Si_yCH_{1-y}$ (y<1) (in the region of 284.5 eV) other than the signal relating to stoichiometric SiC, is greater than 0.2, according to a C1s signal measured by an X-ray photoelectron spectroscopic analyzer (XPS), can favorably constitutes the carbon-rich surface.

By constructing a surface where a SiC crystal is grown such that the ratio R is greater than 0.2, i.e. such that the excess amount of carbons (C) is present at the surface, development of a periodic stepwise pattern is made easier, thereby a stepwise pattern (step-terrace structure) having a superior periodicity and a large band gap can be formed.

Heating under a carbon-containing atmosphere is preferably conducted in an atmosphere containing 10% or less of carbonaceous gas. By adding a trace amount of carbonaceous gas into an atmosphere such as a hydrogen gas so that the carbonaceous gas concentration in the carbon-containing atmosphere is in the range of 10% or less, the SiC crystal is epitaxially grown on the carbon-rich surface and a periodic stepwise pattern can be developed, which is advantageous to form a desired surface.

The SiC substrate having a periodic stepwise pattern (step-terrace structure) is favorably used for production of SiC-based devices such as the ones that can operate at a high temperature.

Hereinafter, favorable embodiments of the method of producing a semiconductor material of the present invention will be described in detail with reference to FIG. 1 to FIG. 3, including the details according to the semiconductor material of the present invention and the semiconductor device using the same.

As shown in FIG. 1, the semiconductor material of the embodiments is a SiC substrate having a stepwise pattern (step-terrace structure) consisting of (0001)-plane terraces and (11-2n)-plane steps, where $n \geq 0$.

The SiC substrate (SiC semiconductor material) used in the embodiments is prepared so that a step-terrace structure consisting of (0001)-plane terraces and (11-2n)-plane steps, where $n \geq 0$, are formed on the surface thereof, according to the following method.

A SiC substrate having a [0001] axis tilted toward the [11-20] direction by 1° or more is placed, for example, in a chamber of a CVD apparatus and heated under a carbon-containing atmosphere. By heating the substrate before performing epitaxial growth by a CVD method, so that a carbon exist on the surface of the SiC substrate, a surface on which a large amount of carbon exist, in particular, a surface on which an excess amount of carbon exist (a carbon-rich surface), can be formed.

The state where the surface of a SiC substrate is carbon-rich means a state where surplus carbons which are not related to binding in SiC (silicon carbide in a stoichiometric condition) such as $SiC_x$, where x>1, graphite, or $Si_yCH_{1-y}$, where y<1, are deposited on the surface.

The carbon-containing atmosphere is obtained by adding a trace amount of acetylene $(C_2H_2)$ gas, specifically 0.7% of the total amount of the gas, to a hydrogen gas which is supplied into the chamber of CVD apparatus as a carrier gas.

The carbon-containing atmosphere can also be formed by adding other carbonaceous gases of $CH_4$, $C_3H_8$, $C_2H_4$, $CCl_4$ and the like, or a released carbon from carbon products placed in the chamber (e.g. a graphite susceptor).

When a carbonaceous gas is added, the concentration of the carbonaceous gas in the carbon-containing atmosphere is preferably 10% or less, more preferably 5% or less, and still more preferably 1% or less. The lower limit value thereof is 0.001%.

It is preferable that heating is performed so that a temperature of the substrate is in the range of 100 to 1,900° C., more preferably 800 to 1,800° C. The period of heating is preferably 0.01 to 5 hours, but may appropriately be determined according to the conditions or the amounts of the carbon to be deposited on the surface.

After a carbon-rich surface is formed on the SiC substrate by heating in a carbon-containing atmosphere, a SiC crystal is epitaxially grown on the carbon-rich surface by a CVD method. Here, periodic step and terrace structures are formed on the carbon-rich surface of the SiC substrate.

The SiC substrate is preferably a 4H—SiC or a 6H—SiC substrate, and may be any of a CMP (Chemical Mechanical Polish)-polished substrate, a mirror-surfaced substrate and a substrate on which irregular steps are formed.

Figure 2:
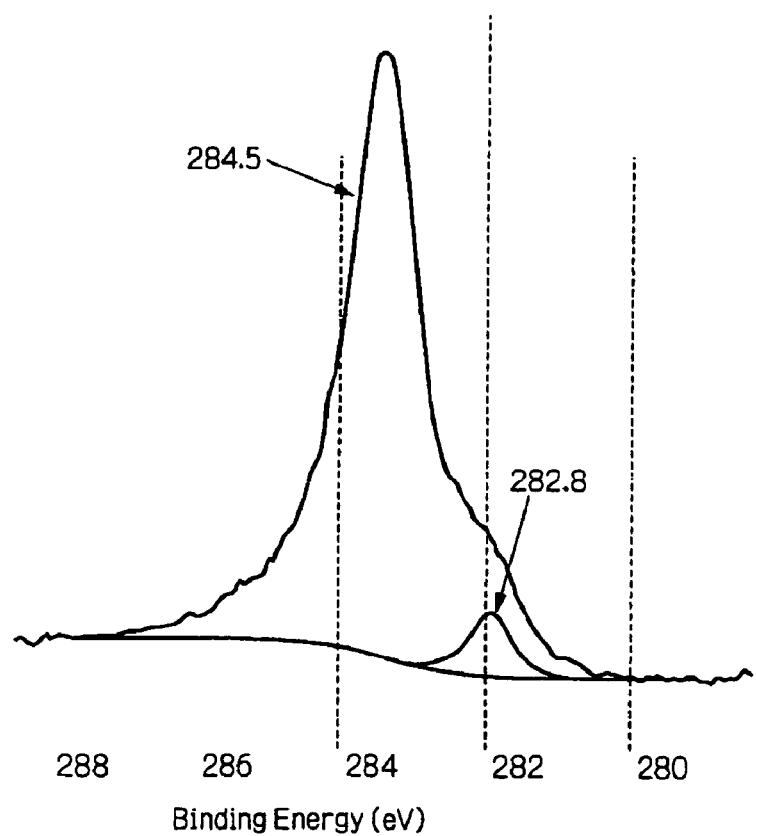
FIG. 2 is an example showing that a C1s spectrum measured by an XPS consists of a signal $I_{282.8}$ having a peak at a binding energy which relates to SiC (in the region of 282.8 eV) and a signal $I_{284.8}$ having a peak at a binding energy which relates to graphite or $SiC_x$ (x>1) (in the region of approximately 284.5 eV).

The above-mentioned carbon-rich surface is, as shown in FIG. 2, the surface in which the ratio R $(I_{284.5}/I_{282.8})$ of $I_{282.8}$ $(I_{SiC})$, an integrated intensity of a signal having a peak at a binding energy relating to stoichiometric SiC (in the region of 282.8 eV), and $I_{284.5}$ (Ic), an integrated intensity of a signal having a peak at a binding energy relating to graphite, $SiC_x$ (x>1), or $Si_yCH_{1-y}$ (y<1) (in the region of 284.5 eV), is greater than 0.2, according to a C1s spectrum measured by an X-ray photoelectron spectroscopic analyzer (XPS).

As an XPS, ESCA LAB MKII (manufactured by VG Co., Ltd.) can be used, for example.

When the R value is greater than 0.2, a carbon-rich surface where a large amount of carbon exist can be formed. The R value is preferably greater than 1 and more preferably greater than 2, from the viewpoint of forming the carbon-rich surface more favorably. When the R value is less than 0.2, periodical step-and terrace structures, in particular the periodical step-terrace structure consisting of terraces having a width of 40 nm or more and steps having a height 5 nm or more cannot be formed when the SiC crystal is epitaxially grown.

The R value can be controlled by optionally selecting the degree of a carbonaceous gas to be added to a hydrogen gas which is a carrier gas, the degree of the carbon released from carbon products, the temperature for heating process, the time length of the heating process, and the like.

The concentration of carbon is greater in the region closer to the surface of the SiC substrate. Consequently, when the angle formed between the normal direction to the SiC substrate surface and the direction of the XPS detector is larger, the obtained information consists of the values in the shallower region, therefore the R value becomes higher. To eliminate such an uncertainty, it is desirable to perform the measurement at a predetermined angle formed between the normal direction to the SiC substrate surface and the direction of the detector (e.g. at an angle of 150°).

The height of the step (h) (see FIG. 1) is preferably higher, specifically 5 nm or more, more preferably 10 nm or more, and still more preferably 20 nm or more. The width of the terrace (w) is preferably wider, specifically 40 nm or more, and more preferably 80 nm or more. The step height (h) and the terrace width (w) can be measured by using an atomic force microscope (AFM) or a transmission electron microscope (TEM).

The step-terrace structure formed as above is obtained by performing epitaxial growth. Therefore, a SiC crystal can be grown while the step-terrace structure is maintained, thereby devices comprising SiC such as quantum-wire, electronic, and optical devices can favorably be produced.

Hereinafter, illustrative embodiments of the present invention will be described in detail.

1. A semiconductor material comprising a stepwise surface structure of (0001)-plane terraces having a width of 40 nm or more and (11-2n)-plane steps having a height of 5 nm or more, where $n \geq 0$.
2. A semiconductor material according to 1, wherein the height of the steps is 20 nm or more.
3. A semiconductor material according to 1, wherein the width of the terraces is 80 nm or more.
4. A semiconductor device comprising the semiconductor material according to 1.
5. A semiconductor device comprising the semiconductor material according to 4, further comprising a non-doped SiC layer and an N-doped SiC layer sequentially stacked thereon.
6. A method of producing the semiconductor material according to 1, wherein an SiC substrate having a [0001] axis tilted toward the [11-20] direction by 1° or more is heated in a carbon-containing atmosphere to form a carbon-rich surface and an SiC crystal is epitaxially grown thereon.
7. A method of producing a semiconductor material according to 6, wherein the SiC substrate is a 4H—SiC substrate.
8. A method of producing a semiconductor material according to 6, wherein the SiC substrate is a 6H—SiC substrate.
9. A method of producing a semiconductor material according to 6, wherein the SiC substrate is an N-doped SiC substrate.
10. A method of producing a semiconductor material according to 6, wherein the ratio R ($I_C/I_{SiC}$) of an integrated intensity $I_{SiC}$ of a C1s signal relating to stoichiometric SiC to an integrated intensity $I_C$ of a C1s signal relating to carbon other than the signal relating to stoichiometric SiC, as measured by an X-ray photoelectron spectroscopic analyzer (XPS), is greater than 0.2.
11. A method of producing a semiconductor material according to 6, wherein the ratio R ($I_C/I_{SiC}$) of an integrated intensity $I_{SiC}$ of a C1s signal having a peak at a binding energy relating to stoichiometric SiC to an integrated intensity $I_C$ of a C1s signal having a peak at a binding energy relating to graphite, $SiC_x$, where x>1, or $Si_yCH_{1-y}$, where y<1, as measured by an X-ray photoelectron spectroscopic analyzer (XPS), is greater than 0.2.
12. A method of producing a semiconductor material according to 10, wherein the ratio R=($I_C/I_{SiC}$) is greater than 1.
13. A method of producing a semiconductor material according to 10, wherein the ratio R=($I_C/I_{SiC}$) is greater than 2.
14. A method of producing a semiconductor material according to 6, wherein the SiC substrate is heated in a carbon-containing atmosphere in which the concentration of a carbonaceous gas is 10% or less.
15. A method of producing a semiconductor material according to 10, wherein the heating is performed in a carbon-containing atmosphere in which the concentration of a carbonaceous gas is 10% or less.
16. A method of producing a semiconductor material according to 6, wherein the heating is performed in a carbon-containing atmosphere in which the concentration of a carbonaceous gas is 5% or less.
17. A method of producing a semiconductor material according to 6, wherein the heating is performed in a carbon-containing atmosphere in which the concentration of a carbonaceous gas is 1% or less.
18. A method of producing a semiconductor material according to 6, wherein the carbon-containing atmosphere is obtained by supplying a gas containing a material selected from the group consisting of $C_2H_2$, $C_2H_4$, $CH_4$, $C_3H_8$, and $CCl_4$.
19. A method of producing a semiconductor material according to 6, wherein the carbon-containing atmosphere is obtained by supplying a carbon released from carbon products.

EXAMPLES

Hereinafter, the present invention will be described with reference to the Examples, but the invention is not limited thereto.

Example 1

A commercially available 4H—SiC substrate (4H—SiC (0001) 8° off toward [11-20] Si-face) was washed with an organic solvent and an oxide layer was removed with a hydrogen fluoride solution. The SiC substrate was placed in a chamber of a CVD apparatus.

The chamber is connected with, although not shown in the Figures, a hydrogen gas-supplying system for supplying a hydrogen ($H_2$) gas as a carrier gas, a carbon-source gas-supplying system for supplying an acetylene ($C_2H_2$) gas as a carbon-source gas, and a Si-source gas-supplying system for supplying a $SiH_2Cl_2$ gas as a Si source gas, and is equipped with a heater for heating the interior of the chamber, so that a carbon-rich surface and a step-terrace structure can be formed on the SiC substrate.

A $C_2H_2$-added $H_2$ gas atmosphere (carbon-containing atmosphere) in which the content of $C_2H_2$ is 0.7% was formed in the chamber by supplying a $H_2$ carrier gas from the hydrogen gas-supplying system and a $C_2H_2$ gas from the carbon-source gas-supplying system. The SiC substrate was heated at 1,650° C. under the aforementioned atmosphere, then a carbon-rich surface containing a large amount of carbon was formed on the SiC substrate.

Here, the SiC substrate was taken out from the chamber and the surface composition was evaluated by ESCA LAB MKII (manufactured by VG Co., Ltd.). Specifically, as shown in FIG. 2, a C1s spectrum consisting of $I_{282.8}$, an integral intensity of a signal having a peak at a binding energy of 282.8 eV which derives from the stoichiometric SiC bond, and $I_{284.5}$, an integral intensity of a signal having a peak at a binding energy of 284.5 eV which derives from graphite, $SiC_x$ (x>1), or $Si_yCH_{1-y}$ (y<1), and is higher than the binding energy which derives from the stoichiometric SiC by 0.5 to 3 eV, was calculated.

The angle formed between the normal direction to the SiC substrate surface and the direction of the XPS detector was 150°. The ratio of the two integral intensities R ($I_{284.5}/I_{282.8}$) was 17, indicating a carbon-rich surface which satisfies R>0.2 was formed.

Subsequently, at a temperature where a substrate temperature was 1,650° C., a SiC crystal layer was epitaxially grown to form a step-terrace structure on the carbon-rich surface of the SiC substrate in accordance with a known CVD method using hydrogen ($H_2$) as a carrier gas, and $SiH_2Cl_2$ and $C_2H_2$ as material gases.

Evaluation

1. Surface Structure of the SiC Substrate

Figure 3:
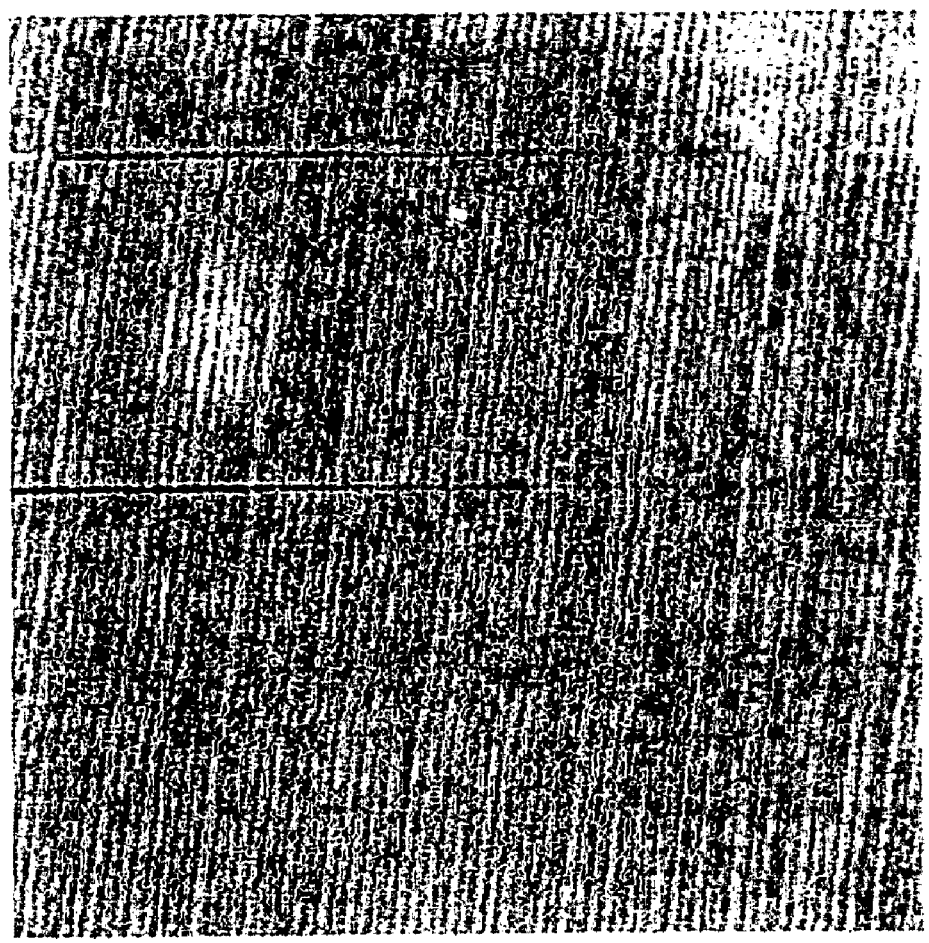
FIG. 3 is an AFM image showing the step-terrace structure formed in Embodiments.
Figure 3:
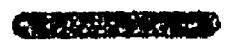

The three-dimensional structure shown in FIG. 3 was obtained by scanning the SiC substrate after epitaxial growth in the XY direction with an atomic force microscope NV2000 [manufactured by Olympus Optics Co., Ltd.; Atomic Force Microscope (AFM)]. A periodic structure in the form of streaks extending in the direction of [1-100], as shown in FIG. 1, was observed. A periodic stepwise pattern was also observed by the cross-sectional analysis in the direction of [1-100].

2. Cross-Sectional Structure of the SiC Substrate

The SiC substrate after epitaxial growth was analyzed by a transmission electron microscope 4000FX (manufactured by Japan Electron Co., Ltd.; TEM). The electron beam was irradiated in the direction of [1-100]. A stepwise pattern consisting of (0001)-plane terraces having a width (w) of 140 nm and (11-2n)-plane steps [n≧0] having a height (h) of 25 nm was observed.

Example 2

A step-terrace structure was formed on the carbon-rich surface of a SiC substrate in the same manner as Example 1, except that a commercially available 6H—SiC substrate (6H—SiC (0001) 3.5° off toward [11-20] Si-plane) was used instead of the 4H—SiC substrate, and the carbon was supplied from a carbon susceptor for holding the substrate (a graphite substrate holder), which is not shown, to, instead of the $C_2H_2$ gas.

The SiC substrate on which a carbon-rich surface was formed by heating, before performing epitaxial growth, was taken out from the chamber and the surface structure thereof was evaluated by conducting an XPS measurement, in the same manner as Example. A C1s spectrum comprising two integral intensities $I_{282.8}$ and $I_{284.5}$ (=I) was obtained. The ratio R of the two integral intensities ($I_{284.5}/I_{282.8}$) was 10, indicating the carbon-rich surface which satisfies the condition of R>0.2 was formed.

Evaluation

1. Surface Structure of the SiC Substrate

The surface structure (three-dimensional shape) of the SiC substrate after epitaxial growth was analyzed in the same manner as Example 1. A periodic structure in the form of streaks extending in the direction of [1-100] was observed. A cross-sectional analysis in the direction of [1-100] (see FIG. 1) was also conducted and formation of a periodic stepwise pattern was observed.

2. Cross-Sectional Structure of the SiC Substrate

The SiC substrate after performing epitaxial growth was analyzed in the same manner as Example 1. A stepwise pattern consisting of (0001)-plane terraces having a width of 120 nm and (11-2n)-plane steps, where n≧0, having a height of 15 nm was observed.

Example 3

A carbon-rich surface was formed on a SiC substrate in the same manner as Example 1, except that a commercially available N-doped SiC substrate ($N^+$; 4H—SiC (0001) 8° off toward [11-20] Si-plane), N-doped, carrier concentration: $1 \times 10^{19}$ $cm^{-3}$) was used instead of the 4H—SiC substrate. The integral intensity ratio R ($I_{284.5}/I_{282.8}$) was 17, satisfying the condition of R>0.2.

Subsequently, at a temperature where a substrate temperature was 1,650° C., a SiC was homo-epitaxially grown in the form of a film on the carbon-rich surface of the N-doped SiC substrate, in accordance with a known CVD method [carrier gas: $H_2$, material gases: $SiH_2Cl_2$ and $C_2H_2$, and an N-type conduction material: $N_2$ (dope amount: $1 \times 10^{19}$ $cm^{-3}$)], thereby a step-terrace structure (SiC layer) 13 was formed on the carbon-rich surface 12 of the N-doped SiC substrate 11 (see FIG. 4).

Evaluation

1. Surface Structure of the SiC Substrate

The surface structure (three-dimensional shape) of the N-doped SiC substrate after performing epitaxial growth was analyzed in the same manner as Example 1. A periodic structure in the form of streaks extending in the direction of [1-100] was observed.

2. Cross-Sectional Structure of the SiC Substrate

The cross-sectional structure of the N-doped SiC substrate after performing epitaxial growth was analyzed in the same manner as Example 1. A stepwise pattern consisting of (0001)-plane terraces having a width of 1200 nm and (11-2n)-plane steps, where n≧0, having a height of 150 nm was observed.

Subsequently, a non-doped SiC layer (non-N-doped 4H—SiC) 14 having a film thickness of 150 nm was epitaxially grown on the step-terrace structure 13 formed on the carbon-rich surface 12 of the N-doped SiC substrate 11, in accordance with a known CVD method [carrier gas: $H_2$, material gases: $SiH_4$ and $C_3H_8$].

Figure 4:
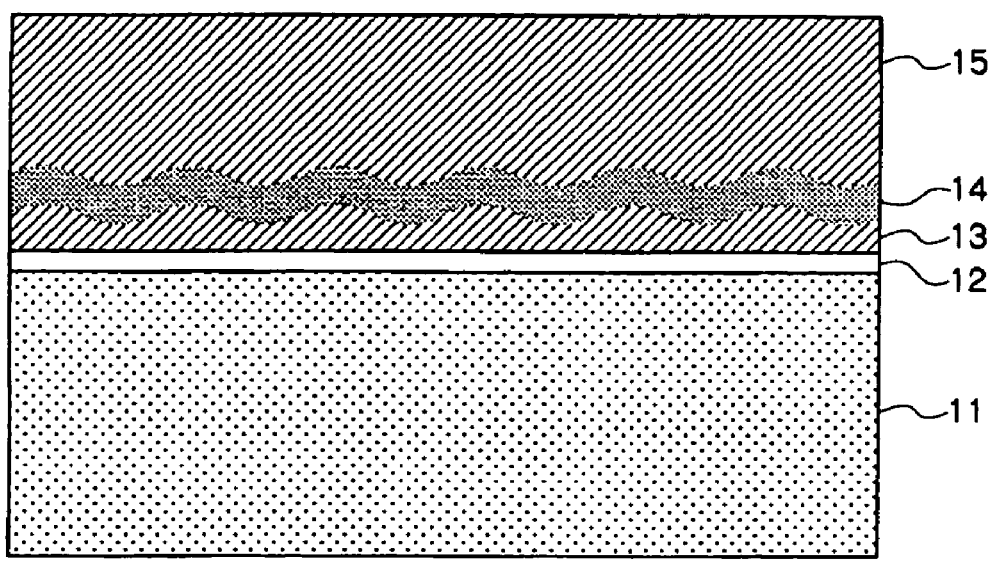
FIG. 4 is a schematic sectional view illustrating the structure of an optical waveguide device prepared in Example 3.

An N-doped SiC layer (4H—SiC) 15 having a film thickness of 1 μm was further stacked on the 4H—SiC layer 14, as shown in FIG. 4, by performing epitaxial growth in accordance with a known CVD method [carrier gas: $H_2$, material gases: $SiH_4$ and $C_3H_8$, N-type conduction material: $N_2$ (dope amount: $1 \times 10^{19}$ $cm^{-3}$)], thereby an optical waveguide device was prepared.

Evaluation

3. Waveguide Property

The waveguide property of the optical waveguide device structured as shown in FIG. 4 was evaluated by irradiating light having a wavelength of 405 nm. The resulting transmission loss was less than 1 dB/cm.

Each of the above-described Examples was mainly described as the cases where the content of the $C_2H_2$ gas added to the carbon-containing atmosphere was 0.7%, but a preferable range of the content of a carbonaceous gas in the carbon-containing atmosphere is 10% or less. In such a case, heating can be conducted according to the same method as Examples, a periodic stepwise pattern can be formed more effectively, and a desirable surface structure can be obtained.

Accordingly, the present invention provides a semiconductor material having a stepwise pattern (step-terrace structure) that is thermally stable and superior in periodicity, a production method thereof, and a semiconductor device superior in waveguiding properties.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a semiconductor material comprising:

heating a SiC substrate having an axis tilted toward a [11-20] direction by 1° or more in a carbon-containing atmosphere;

forming a carbon-rich surface on the SiC substrate such that the SiC substrate includes carbon atoms which are not related to binding in SiC on the carbon-rich surface of the substrate, wherein the carbon-rich surface includes different ratios R of integrated intensity of a signal having a peak at a binding energy relating to stoichiometric SiC and an integrated intensity of a signal having a peak at a binding energy relating to carbon other than the signal relating to stoichiometric SiC;

measuring the different ratios R;

controlling the different ratios R by selecting a degree of a carbonaceous gas to be added to a carrier gas, a degree of carbon released from carbon products, a temperature for a heating process, and a time length of the heating process;

and growing SiC crystal epitaxially on the SiC substrate.

2. The method of producing a semiconductor material according to claim 1, wherein the SiC substrate is a 4H—SiC substrate.

3. A method of producing a semiconductor material according to claim 1, wherein the SiC substrate is a 6H—SiC substrate.

4. A method of producing a semiconductor material according to claim 1, wherein the SiC substrate is an N-doped SiC substrate.

5. The method of producing a semiconductor material according to claim 1, wherein the ratio $R=(I_c/I_{SiC})$ of an integrated intensity $I_{SiC}$ of a C1s signal relating to stoichiometric SiC to an integrated intensity $I_c$ of a C1s signal relating to carbon other than the C1s signal relating to stoichiometric SiC, is greater than 0.2.

6. The method of producing a semiconductor material according to claim 5, wherein the ratio $R=(I_C/I_{SiC})$ of integrated intensity of a signal having a peak at a binding energy relating to stoichiometric SiC and an integrated intensity of a signal having a peak at a binding energy relating to carbon other than the signal relating to stoichiometric SiC is greater than 1.

7. The method of producing a semiconductor material according to claim 5, wherein the ratio $R=(I_C/I_{SiC})$ of integrated intensity of a signal having a peak at a binding energy relating to stoichiometric SiC and an integrated intensity of a signal having a peak at a binding energy relating to carbon other than the signal relating to stoichiometric SiC is greater than 2.

8. The method of producing a semiconductor material according to claim 5, wherein the heating is performed in a carbon-containing atmosphere in which the concentration of a carbonaceous gas is 10% or less.

9. The method of producing a semiconductor material according to claim 1, wherein the ratio $R=(I_C/I_{SiC})$ of an integrated intensity $I_{SiC}$ of a C1s signal having a peak at a binding energy relating to stoichiometric SiC to an integrated intensity $I_C$ of a C1s signal having a peak at a binding energy relating to graphite, is greater than 0.2.

10. The method of producing a semiconductor material according to claim 1, wherein the SiC substrate is heated in a carbon-containing atmosphere in which the concentration of a carbonaceous gas is 10% or less.

11. The method of producing a semiconductor material according to claim 1, wherein the heating is performed in a carbon-containing atmosphere in which the concentration of a carbonaceous gas is 5% or less.

12. The method of producing a semiconductor material according to claim 1, wherein the heating is performed in a carbon-containing atmosphere in which the concentration of a carbonaceous gas is 1% or less.

13. The method of producing a semiconductor material according to claim 1, wherein the carbon-containing atmosphere is obtained by supplying a gas containing a material selected from the group consisting of $C_2H_2$, $C_2H_4$, $CH_4$, $C_3H_8$, and $CCl_4$.

14. A method of producing a semiconductor material according to claim 1, wherein the carbon-containing atmosphere is obtained by supplying a carbon released from carbon products.

15. The method of producing a semiconductor material according to claim 1, wherein the different ratios R are measured using an X-ray photoelectron spectroscopic analyzer.

* * * * *

UNITED STATES PATENT AND TRADEMARK OFFICE
CERTIFICATE OF CORRECTION

PATENT NO. : 7,678,671 B2
APPLICATION NO. : 11/586680
DATED : March 16, 2010
INVENTOR(S) : Akinori Seki et al.

It is certified that error appears in the above-identified patent and that said Letters Patent is hereby corrected as shown below:

In claim 9, column 10, line 26, "$R=(I_C/I_{SiC})of$" should read --$R=(I_C/I_{SiC})$ of--.

Signed and Sealed this

Fifteenth Day of June, 2010

David J. Kappos
*Director of the United States Patent and Trademark Office*